United States Patent
Moriyama et al.

(10) Patent No.: US 7,273,661 B2
(45) Date of Patent: Sep. 25, 2007

(54) ELECTRICALLY CONDUCTIVE POLYIMIDE COMPOSITIONS HAVING A CARBON NANOTUBE FILLER COMPONENT AND METHODS RELATING THERETO

(75) Inventors: Hideki Moriyama, Nagoya (JP); Kenji Uhara, Nagoya (JP)

(73) Assignee: DuPont Toray Co., Ltd., Tokyo (JP)

( * ) Notice: Subject to any disclaimer, the term of this patent is extended or adjusted under 35 U.S.C. 154(b) by 0 days.

(21) Appl. No.: 10/612,184

(22) Filed: Jul. 2, 2003

(65) Prior Publication Data

US 2004/0071990 A1 Apr. 15, 2004

(30) Foreign Application Priority Data

Jul. 5, 2002 (JP) ............................. 2002-197989

(51) Int. Cl.
*B32B 5/16* (2006.01)
*B32B 27/06* (2006.01)

(52) U.S. Cl. .................. 428/473.5; 428/220; 428/323; 428/332; 428/334; 427/372.2

(58) Field of Classification Search ................ 428/323, 428/332, 473.5, 220, 334
See application file for complete search history.

(56) References Cited

U.S. PATENT DOCUMENTS

| 5,078,936 | A | 1/1992 | Parish et al. | |
|---|---|---|---|---|
| 5,862,296 | A | 1/1999 | Oyama | |
| 6,201,945 | B1 * | 3/2001 | Schlueter et al. | 399/329 |
| 6,465,966 | B2 | 10/2002 | Konuma | |
| 6,574,130 | B2 | 6/2003 | Segal et al. | |
| 6,617,377 | B2 * | 9/2003 | Chacko | 524/99 |

OTHER PUBLICATIONS

C. Park, et al., Dispersion of single wall carbon nanotubes by in situ polymerization under sonifcation, Chemical Physics Letters 364, Oct. 4, 2002, pp. 303-308, Elsevier Science B.V.

* cited by examiner

*Primary Examiner*—Sheeba Ahmed

(57) ABSTRACT

This invention is directed to polyimide films having a carbon nanotube filler to provide a surface resistivity in a range from 50 ohm/square to $1.0 \times 10^{15}$ ohms/square. The electrically conductive polyimides of the present invention have an excellent balance of properties relative to conventional polyimides having a conductive filler, due at least in part to the film's water content, degree of imidization and polymer orientation.

9 Claims, No Drawings

ELECTRICALLY CONDUCTIVE POLYIMIDE COMPOSITIONS HAVING A CARBON NANOTUBE FILLER COMPONENT AND METHODS RELATING THERETO

FIELD OF THE INVENTION

The present invention relates generally to electrically conductive polyimide type compositions, particularly films, having an advantageous surface resistivity and volume resistivity due (at least in part) to the presence of a carbon nanotube filler. More specifically, an improved balance of properties is possible by drying a precursor to a particular level and (optionally) imposing a controlled draw (e.g., unilateral or bilateral stretching) prior to final (i.e., substantially complete) imidization.

BACKGROUND

Polyimide films are known to have excellent electrical insulating properties, as well as high mechanical strength and resistance to chemical degradation. Such films are often used as a base film for flexible circuit boards laminated to metal foils, such as copper foil or the like. However, unwanted static build-up and discharge can occur with standard polyimide films, and this can be problematic in certain types of circuit design. A need therefore exists for a polyimide film having anti-static properties without unduly harming other desired polyimide properties, e.g., high heat resistance, thin layer formability, high mechanical flexibility and excellent toughness.

U.S. Pat. No. 5,078,936 discloses an electrically conductive polyimide film with a carbon powder filler. Surface resistivity of these films range from about 130 ohms/square to $10^{10}$ ohms/square depending on the loading level of carbon used.

SUMMARY OF THE INVENTION

Overview:

The present invention is directed to an electrically conductive or antistatic layer having at least two phases: i. a non-conductive continuous or discontinuous phase; and ii. a conductive discontinuous phase. The layer generally has a thickness between two and 500 microns.

Optionally, a precursor layer to the final electrically conductive layer of the present invention is also stretched in one or more directions to provide the final composition with a surface and/or volume resistivity between, and including, any two of the following 50, 75, 100, 250, 500, 750, $1 \times 10^1$, $1 \times 10^2$, $1 \times 10^3$, $1 \times 10^4$, $1 \times 10^5$, $1 \times 10^6$, $1 \times 10^7$, $1 \times 10^8$, $1 \times 10^9$, $1 \times 10^{10}$, $1 \times 10^{11}$, $1 \times 10^{12}$, $1 \times 10^{13}$, $1 \times 10^{14}$, and $1 \times 10^{15}$ ohms per square (ohm-cm for volume resistivity).

The compositions of the present invention have been found to surprisingly provide an excellent balance of electrical and mechanical properties, relative to conventional polyimide compositions containing an electrically conductive filler.

First Phase:

The first phase of the present invention comprises a polyimide base polymer. "Base polymer" as used herein is intended to mean the dominant polymer component (at least 25, 30, 35, 40, 45, 50, 55, 60, 65, 70, 75, 80, 85, 90, 95 or 100 weight percent of all polymers present in the layer). Generally speaking, the base polymer will be at least 25, 30, 35, 40, 45, 50, 55, 60, 65, 70, 75, 80, 85, 90, 95 or 100 weight percent of the overall layer.

The base polymer of the present invention is a polyimide synthesized by a poly-condensation reaction, involving the reaction of one or more aromatic diamine components with one or more aromatic dianhydride components, or can optionally contain aliphatic, or cyclo-aliphatic diamines or dianhydrides.

As used herein, an "aromatic" monomer is intended to mean a monomer having at least one aromatic ring, either alone (i.e., a substituted or unsubstituted, functionalized or unfunctionalized benzene or similar-type aromatic ring) or connected to another (aromatic or aliphatic) ring. An aromatic backbone chain segment is intended to mean at least one aromatic moiety between two adjacent imide linkages.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the dianhydride as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) or acid ester functionality (or any other functionality presently known or developed in the future which is capable of conversion to anhydride functionality or takes the place of it in the polymerization/imidization reaction).

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Second Phase:

The compositions of the present invention further comprise a discontinuous conductive second phase, comprising a plurality of carbon nanotube particles. The weight percent of the second phase (based upon the total weight of both phases) is in a range between, and including, any two of the following percentages: 0.10, 0.20, 0.30, 0.40, 0.50, 0.75, 1.0, 2.0, 3.0, 4.0, 5.0, 10.0, 15.0, 20.0, 25.0, 30.0 35.0, 40.0, 45.0, 46, 47, 48, 49, and 50 percent.

DETAILED DESCRIPTION OF THE PREFERRED EMBODIMENT(S)

The preferred polyimide materials used in accordance with this invention include any conventional polyimide thermally converted from a polyamic acid derived from a reaction of a dianhydride and a diamine, examples of which are disclosed in U.S. Pat. Nos. 3,179,630 and 3,179,634.

The polyamic acids can be made by dissolving approximately equimolar amounts of a dianhydride and a diamine in a solvent and agitating the resulting solution under controlled temperature conditions until polymerization of the dianhydride and the diamine is completed.

Suitable dianhydrides for use in the polyimides include:
1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphthalic anhydride (ODPA);
5. 3,3',4,4'-diphenylsulfone tetracarboxylic dianhydride (DSDA);
6. 4,4'-(4,4'-isopropylidenediphenoxy)bis(phthalic anhydride) (BPADA);
7. 2,3,6,7-naphthalene tetracarboxylic dianhydride;
8. 1,2,5,6-naphthalene tetracarboxylic dianhydride;
9. 1,4,5,8-naphthalene tetracarboxylic dianhydride;
10. 2,6-dichloronaphthalene-1,4,5,8-tetracarboxylic dianhydride;
11. 2,7-dichloronaphthalene-1,4,5,8-tetracarboxylic dianhydride;
12. 2,3,3',4'-biphenyl tetracarboxylic dianhydride;
13. 2,2',3,3'-biphenyl tetracarboxylic dianhydride;
14. 2,3,3',4'-benzophenone tetracarboxylic dianhydride;
15. 2,2',3,3'-benzophenone tetracarboxylic dianhydride;
16. 2,2-bis(3,4-dicarboxyphenyl) propane dianhydride;
17. 1,1-bis(2,3-dicarboxyphenyl) ethane dianhydride;
18. 1,1-bis(3,4-dicarboxyphenyl) ethane dianhydride;
19. bis(2,3-dicarboxyphenyl) methane dianhydride;
20. bis(3,4-dicarboxyphenyl) methane dianhydride;
21. 4,4'-(hexafluoroisopropylidene) diphthalic anhydride (6FDA);
22. bis(3,4-dicarboxyphenyl) sulfoxide dianhydride;
23. tetrahydrofuran-2,3,4,5-tetracarboxylic dianhydride;
24. pyrazine-2,3,5,6-tetracarboxylic dianhydride;
25. thiophene-2,3,4,5-tetracarboxylic dianhydride;
26. phenanthrene-1,8,9,10-tetracarboxylic dianhydride;
27. perylene-3,4,9,10-tetracarboxylic dianhydride;
28. bis-1,3-isobenzofurandione;
29. bis (3,4-dicarboxyphenyl) thioether dianhydride;
30. bicyclo[2.2.2]oct-7-ene-2,3,5,6-tetracarboxylicdianhydride;
31. 2-(3',4'-dicarboxyphenyl) 5,6-dicarboxybenzimidazole dianhydride;
32. 2-(3',4'-dicarboxyphenyl) 5,6-dicarboxybenzoxazole dianhydride;
33. 2-(3',4'-dicarboxyphenyl) 5,6-dicarboxybenzothiazole dianhydride;
34. bis (3,4-dicarboxyphenyl) 2,5-oxadiazole 1,3,4-dianhydride;
35. bis 2,5-(3',4'-dicarboxydiphenylether) 1,3,4-oxadiazole dianhydride;
36. and the like;
37. their acid ester and their acid chloride derivatives.

Suitable diamines for use in the polyimides include:
1. 2,2 bis-(4-aminophenyl) propane;
2. 4,4'-diaminodiphenyl methane;
3. 4,4'-diaminodiphenyl sulfide (4,4'-DDS);
4. 3,3'-diaminodiphenyl sulfone (3,3'-DDS);
5. 4,4'-diaminodiphenyl sulfone;
6. 4,4'-diaminodiphenyl ether (4,4'-ODA);
7. 3,4'-diaminodiphenyl ether (3,4'-ODA);
8. 1,3-bis-(4-aminophenoxy) benzene (APB-134);
9. 1,3-bis-(3-aminophenoxy) benzene (APB-133);
10. 1,2-bis-(4-aminophenoxy) benzene;
11. 1,2-bis-(3-aminophenoxy) benzene;
12. 1,4-bis-(4-aminophenoxy) benzene;
13. 1,4-bis-(3-aminophenoxy) benzene;
14. 1,5-diaminonaphthalene;
15. 1,8-diaminonaphthalene;
16. 2,2'-bis(trifluoromethylbenzidine)
17. 4,4'-diaminodiphenyldiethylsilane;
18. 4,4'-diaminodiphenylsilane;
19. 4,4'-diaminodiphenylethylphosphine oxide;
20. 4,4'-diaminodiphenyl-N-methyl amine;
21. 4,4'-diaminodiphenyl-N-phenyl amine;
22. 1,2-diaminobenzene (OPD);
23. 1,3-diaminobenzene (MPD);
24. 1,4-diaminobenzene (PPD);
25. 2,5-dimethyl-1,4-diaminobenzene;
26. 2-(trifluoromethyl)-1,4-phenylenediamine;
27. 5-(trifluoromethyl)-1,3-phenylenediamine;
28. 2,2-Bis[4-(4-aminpnenoxy)phenyl]-hexafluoropropane;
29. 2,2-bis(3-aminophenyl) 1,1,1,3,3,3-hexafluoropropane;
30. benzidine;
31. 4,4'-diaminobenzophenone;
32. 3,4'-diaminobenzophenone;
33. 3,3'-diaminobenzophenone;
34. m-xylylene diamine;
35. bisaminophenoxyphenylsulfone;
36. 4,4'-isopropylidenedianiline;
37. N,N-bis-(4-aminophenyl) methylamine;
38. N,N-bis-(4-aminophenyl) aniline
39. 3,3'-dimethyl-4,4'-diaminobiphenyl;
40. 4-aminophenyl-3-aminobenzoate;
41. 2,4-diaminotoluene;
42. 2,5-diaminotoluene;
43. 2,6-diaminotoluene;
44. 2,4-diamine-5-chlorotoluene;
45. 2,4-diamine-6-chlorotoluene;
46. 4-chloro-1,2-phenylenediamine;
47. 4-chloro-1,3-phenylenediamine;
48. 2,4-bis-(beta-amino-t-butyl) toluene;
49. bis-(p-beta-amino-t-butyl phenyl) ether;
50. p-bis-2-(2-methyl-4-aminopentyl) benzene;

51. 1-(4-aminophenoxy)-3-(3-aminophenoxy) benzene;
52. 1-(4-aminophenoxy)-4-(3-aminophenoxy) benzene;
53. 2,2-bis-[4-(4-aminophenoxy)phenyl]propane (BAPP);
54. bis-[4-(4-aminophenoxy)phenyl]sulfone (BAPS);
55. 2,2-bis[4-(3-aminophenoxy)phenyl]sulfone (m-BAPS);
56. 4,4'-bis-(aminophenoxy)biphenyl (BAPB);
57. bis(4-[4-aminophenoxy]phenyl) ether (BAPE);
58. 2,2'-bis-(4-aminophenyl)-hexafluoropropane (6F diamine);
59. 2,2'-bis-(4-phenoxy aniline) isopropylidene;
60. 2,4,6-trimethyl-1,3-diaminobenzene;
61. 4,4'-diamino-2,2'-trifluoromethyl diphenyloxide;
62. 3,3'-diamino-5,5'-trifluoromethyl diphenyloxide;
63. 4,4'-trifluoromethyl-2,2'-diaminobiphenyl;
64. 4,4'-oxy-bis-[(2-trifluoromethyl) benzene amine];
65. 4,4'-oxy-bis-[(3-trifluoromethyl) benzene amine];
66. 4,4'-thio-bis-[(2-trifluoromethyl) benzene-amine];
67. 4,4'-thiobis-[(3-trifluoromethyl) benzene amine];
68. 4,4'-sulfoxyl-bis-[(2-trifluoromethyl) benzene amine];
69. 4,4'-sulfoxyl-bis-[(3-trifluoromethyl) benzene amine];
70. 4,4'-keto-bis-[(2-trifluoromethyl) benzene amine];
71. 9,9-bis(4-aminophenyl)fluorene;
72. 1,3-diamino-2,4,5,6-tetrafluorobenzene;
73. 3,3'-bis(trifluoromethyl)benzidine;
74. and the like.

Examples of preferred polyimides used in accordance with the present invention can be derived from a dianhydride selected from the group consisting of,
1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphtalic anhydride (ODPA);
5. 3,3',4,4'-diphenylsulfone tetracarboxylic dianhydride (DSDA);
6. 4,4'-(4,4'-isopropylidenediphenoxy)bis(phthalic anhydride) (BPADA);
7. 2,3,6,7-naphthalene dicarboxylic acid;
8. 2,2-bis(3,4-dicarboxy phenyl) ether;
9. pyridine-2,3,5,6-tetracarboxylic acid; and
10. amide forming derivatives of the above, and from a diamine selected from the group consisting of:
1. 4,4'-diaminodiphenyl ether (4,4'-ODA);
2. 3,4'-diaminodiphenyl ether (3,4'-ODA);
3. 1,3-diaminobenzene (MPD);
4. 1,4-diaminobenzene (PPD);
5. 2,2-bis-[4-(4-aminophenoxy)phenyl]propane (BAPP);
6. bis-[4-(4-aminophenoxy)phenyl]sulfone (BAPS);
7. 2,2-bis[4-(3-aminophenoxy)phenyl]sulfone (m-BAPS);
8. 4,4'-bis-(aminophenoxy)biphenyl (BAPB);
9. bis(4-[4-aminophenoxy]phenyl) ether (BAPE);
10. 4,4'-diaminodiphenyl methane;
11. 4,4'-diaminodiphenylsulphone;
12. 3,3'-dimethyl-4,4'-diaminodiphenyl methane;
13. 1,5-diamino naphthalene,
14. 3,3'-dimethoxy benzidine; and
15. 1,4-bis (3 methyl-5-aminophenyl) benzene.

A preferred polyimide in the present invention can be derived from reacting 4,4'-diaminodiphenyl ether (4,4'-ODA) with pyromellitic dianhydride (PMDA). Copolyimides derived from any of the above diamines and dianhydrides are generally operable as well. Particularly preferred copolyimides can be those derived from 15 to 85 mole % of 3,3',4,4'-biphenyltetracarboxylic dianhydride, 15 to 85 mole % pyromellitic dianhydride, 30 to 100 mole % p-phenylenediamine and 0 to 70 mole % of 4,4'-diaminodiphenyl ether. Such copolyimides are described in U.S. Pat. Nos. 4,778,872 and 5,166,308, which are incorporated herein by reference. Optionally, aliphatic and cyclo-aliphatic diamines and dianhydrides may be substituted for some of the aromatic diamines or dianhydrides.

Preferred solvents include N-methylpyrrolidinone (NMP), dimethylacetamide (DMAc), gamma-butyrolactone, N,N'-dimethylformamide (DMF), dimethyl sulfoxide (DMSO), and tetramethyl urea (TMU). In one embodiment, the preferred solvent is dimethylacetamide (DMAc).

Co-solvents can also be used generally at about five to 50 weight percent of the total solvent. Useful co-solvents include xylene, toluene, benzene, diethyleneglycol diethyl ether, 1,2-dimethoxyethane (monoglyme), diethylene glycol dimethyl ether (diglyme), 1,2-bis-(2methoxyethoxy) ethane (triglyme), bis [2-(2-methoxyethoxy) ethyl)] ether (tetraglyme), bis-(2-methoxyethyl) ether, tetrahydrofuran, "Cellosolve™" (glycol ethyl ether) and "Cellosolve™ acetate" (hydroxyethyl acetate glycol monoacetate), and the like.

The polyamic acid solutions of the present invention are generally made by dissolving the diamine in a dry solvent and slowly adding the dianhydride under conditions of agitation and controlled temperature in an inert atmosphere. The diamine is generally present as a 5 to 15 weight percent solution in the solvent. The diamine and dianhydride are typically used in about equimolar amounts to form a polyamic acid solution ranging from about 5 percent by weight to about 40 percent by weight.

The electrically conductive polyimide films of the present invention are typically formed from a polyamic acid solution containing carbon nanotubes largely or wholly dispersed in the polyamic acid. The polyamic acid can be converted to a polyimide film by conventional imidization and the resulting film will generally possess an electrical surface resistivity of between any of the two following numbers, 50, 60, 70, 80, 90, 100, 200, 500, 1000, 2000, 4000, 8000, $1\times10^5$, $1\times10^6$, $1\times10^7$, $1\times10^8$, $1\times10^9$, $1\times10^{10}$, $1\times10^{11}$, $1\times10^{12}$, $1\times10^{13}$, $1\times10^{14}$ and $1\times10^{15}$ ohms/square. In addition, the electrically conductive films of the present invention often show excellent electrical conductivity without diminishing mechanical properties of the film such as the Young's modulus of elasticity and/or tensile elongation. The films of the present invention generally can widely useful as base films (or the like) for flexible circuit boards laminated with metal (e.g., copper) foil.

The films of the present invention can be formed by dispersing carbon nanotube particles into a base precursor polymer, e.g., a polyamic acid. Carbon nanotube particles can first be dispersed in either the same, or different organic solvent as the polyamic acid. The carbon nanotube particles can be dispersed using any variety of well-known dispersion techniques including kinetic dispersion, ball-milling, media-milling, and the like. The carbon nanotube particles are dispersed to a level (average particle size in at least one dimension) between any two of the following numbers 10, 20, 30, 50, 80, 100, 200, 400, 800, 1000, 2000, 3000, 4000, 5000, 6000, 7000, 8000, 9000, 10000, and 20000 nanometers.

The carbon nanotube particle dispersions are typically at a weight percent in solution ranging from about 0.1, 0.2, 0.4, 0.6, 0.8, 1.0, 2.0, 4.0, 6.0, 8.0, 10, 15, 20, 25, 30, 35, and 40 weight percent. When carbon nanotube dispersions below 0.1 weight percent are used, the flow rate of carbon nanotube dispersion needed to produce a polyimide film with any meaningful electrical conductivity is oftentimes too high. At too high a carbon nanotube dispersion flow rate, control of viscosity of the polyamic acid is often difficult. When the carbon nanotube dispersion is above 40 weight percent, the dispersion viscosity is too high to be accurately metered into the polyamic acid and the dispersion has a tendency to settle in solution. The carbon nanotube dispersion may optionally be mixed with either a small portion of polyamic acid polymer, or other dispersing agent to assist making a stable, uniform dispersion.

In one embodiment, a ring-opening catalyst is used to aid the drying of the polyamic acid. In such an embodiment, an aliphatic tertiary amine can be used, such as, triethylamine, triethylenediamine and the like, or heterocyclic tertiary amine such as isoquinoline, pyridine, and beta picoline and the like are used. Generally speaking, it is often preferred to use at least one kind of amine selected from heterocyclic tertiary amines.

In addition, dehydrating agents can also be used such as aliphatic carboxylic acid anhydrides, such as, acetic anhydride, propionic anhydride, butyric anhydride and aromatic carboxylic acid anhydrides, such as, benzoic anhydride and the like. Acetic anhydride and/or benzoic anhydride are preferred.

The carbon nanotube particles of the present invention may be formed from any of the known formation techniques, such, as arc-discharge and CVD-deposition methods, and pulsed laser vaporization (PLV) method. In the PLV method, a laser pulse typically evaporates a solid target of graphite, containing a small amount of metal catalyst (~1 atomic % Ni and ~1% Co). The laser pulse typically performs the evaporation into a background gas (~500 Torr of Ar) gently flowing through a quartz tube inside a high temperature (~1000° C.) oven. The laser generally converts a small amount of the composite solid material into a plasma of atoms and molecules which contains mainly C, $C_2$, $C_3$, Ni, Co and their ions. These species leave the target with extremely high initial velocities ~(from 1-5)$\times 10^6$ cm/s. This material violently collides with the background gas, typically generating a series of shock waves that can provide additional heating that dissociates and ionizes the initial ejecta. The initial ejecta are generally confined by the background gas to remain inside a "bubble" of hot plasma which typically thermalizes it and expands it in a stepwise way. In short, the starting material for nanotube growth is often a plasma of atomic/molecular carbon species and atomic vapor of catalyst.

Generally as used herein, carbon nanotube particles are cylindrical and have a diameter of 0.1 microns or less. They generally comprise graphite state carbon atoms that monolayer or laminate into multilayer constructions. Carbon nanotube particles can be used with one end or both ends blocked with graphite state carbon atoms.

The carbon nanotube particles of the present invention are generally dispersed in a polyimide at a weight ratio between any two of the following numbers, 0.10, 0.15, 0.20, 0.40, 0.80, 1.0, 2.0, 4.0, 8.0, 10.0, 12.0, 15.0, 17.0, 20.0, 25.0, 30.0, 35.0, 40.0, 45.0, and 50 weight percent. When the concentration of carbon nanotubes in the polyimide is less than 0.10 weight percent, the electrical conductivity of the polyimide is often so low, that the polyimide film may not be considered conductive for certain applications. When the concentration of carbon nanotubes in the polyimide film is greater than 50 weight percent, the film can become too brittle to process or laminate to other metals such as copper. Typically, the useful range of carbon nanotube particles dispersed in the polyimide is between about 0.10 and about 10 weight percent.

The carbon nanotube dispersion can be injected into a polyamic acid stream. The two streams are typically mixed until a substantially homogenous dispersion of nanotube particles and polyamic acid is obtained. This homogeneous blend is commonly referred to as a mixed polymer. The mixed polymer can generally be continuously cast onto a flat surface and dried to form a semi-cured, semi-dried sheet. The typical amount of curing, or imidization of the polyamic acid via a thermal process in this step is generally between about 2 and about 40 percent, more typically about 10 to 30 percent. The typical amount of drying performed in this step is between 40 and 90 percent dry, more typically between 60 and 80 percent dry. The temperatures and processing rates used to semi-cure and semi-dry the film can depend upon the flow rates of the polyamic acid and carbon nanotube dispersion (i.e. the mixed polymer flow rate) as well as the concentration of each stream. The semi-cured and semi-dried film is commonly referred to as a green film. The green film can either be processed through a separate curing oven, or continuously processed in the same oven to a final cure state.

The green film can then be cured (imidized) and dried to form a continuous polyimide film. The amount of imidization of the final film is generally between 90.0 and 99.99 percent cured. Ideally (and if reasonably possible), the film will be totally cured to a polyimide, however practically speaking, this is generally difficult, if not impossible, to confirm. The amount of imidization is typically between 95.0 percent and 99.8 percent. Ideally, the film is between 99.2 and 99.7 percent imidized in its final form. When the film is too highly cured, the film can become brittle and difficult to handle without cracking, at least in some embodiments of the present invention. When the film is under cured or contains too much solvent, it can problematic in applications desiring good physical properties or a low solvent or solvent-free plastic substrate.

Typically, the film is from 95 to 99.99 percent dry of solvent. More typically, the film is from 97 to 99.9 percent dry. Most typically, from 99.8 to 99.5 percent dry.

The thickness of the polyimide film may be adjusted depending upon the intended purpose of the film or final application specifications. It is generally preferred that the thickness of the film ranges from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns.

Generally speaking, the mechanical elongation of the polyimide films of the present invention is substantially higher than prior known polyimide films containing inorganic or organic electrically conductive particle fillers. When polyimide films are produced with greater than 10 weight percent of a (non-nanotube) electrically conductive particle filler, oftentimes mechanical elongation suffers as a consequence of using the filler. For example, to make a polyimide film electrically conductive using carbon particles (i.e. a non-nanotube carbon particle) it is common to disperse over 15 weight percent carbon in the base polyimide matrix to achieve a significant degree of electrical conductivity. Oftentimes, this amount of (non-nanotube) carbon makes the film brittle and difficult to handle both in its primary processing as well as in its downstream uses.

As such, a need exists to produce a polyimide film that is electrically conductive without unduly harming the mechanical properties of the film. The films of the present invention can achieve equivalent or greater electrical conductivity without suffering a significant loss in mechanical elongation. The films of the present invention often have mechanical elongation values between any two of the following numbers, 30, 35, 40, 45, 50, 55, 60, 65, 70, 75, 80, 85, 90, 95, and 100 percent.

The polyimide films of the present invention can be manufactured in a variety of surface resistivities and volume resistivities depending upon the final application. Depending upon the amount of drawing (stretching) placed on the film, the volume resistivity can be fine tuned to be either lower than the surface resistivity or nearly matched to the surface resistivity. Because of the tubular nature of the electrical conductors (i.e. the carbon nanotubes) the more drawing force applied to the film during drying, and curing, a film with greater surface resistivity and less volume resistivity is formed. While not intending to be bound by any particular theory, the present inventor believes this phenomenon to be true because more of the tubular structures are pulled into the x-y plane of the film under greater drawing forces. Because there may be a higher concentration of carbon nanotubes in the x-y plane the films of the present invention tend to show greater electrical conductivity in the x-y plane (surface resistivity), and less electrical conductivity in the z-axis direction (i.e. volume resistivity) when analyzed after production. It is thus generally preferred to used low drawing forces when making the film to more closely match the surface resistivity value of the film to its corresponding volume resistivity.

The preferred specific volume resistance of polyimide films of this invention range between any two of the following numbers, 50, 60, 70, 80, 90, 100, 200, 500, 1000, 2000, 4000, 8000, $1\times10^5$, $1\times10^6$, $1\times10^7$, $1\times10^8$, $1\times10^9$, $1\times10^{10}$, $1\times10^{11}$, $1\times10^{12}$, $1\times10^{13}$, $1\times10^{14}$ and $1\times10^{15}$ ohms·cm. Finally, the drawing ratio can also directly affect the modulus and mechanical properties of the final film. If a higher modulus film is desired, higher drawing ratios are typically used during drying and curing. Conversely, if the modulus is too high, or the volume resistivity is too low, less drawing force may be used.

The following examples are intended to further illustrate certain embodiments of the present invention but are not intended to limit the present invention in any way.

EXAMPLES

Viscosity—Viscosity of polyamic acid was measured with a rotation viscometer. The viscometer used was a Vismetron (single cylinder type rotation viscometer, model VS-A1, made by Shibaura System Co, Ltd.)

Surface resistivity—was measured with respect to polyimide film in accordance with JIS 6911, using pA METER/ DC VOLTAGE SOURCE 414OB made by Agilent Technology Co, Ltd., and as measurement electrode R12702A made by ADVANTEST Co.

Specific volume resistance—was measured with respect to polyimide film in accordance with JIS 6911, using pA METER/DC VOLTAGE SOURCE 414OB made by Agilent Technology Co, Ltd., and as measurement electrode R12702A made by ADVANTEST Co.

Young's modulus and elongation at breakage—the elongation was measured when sample was broken in tension obtained at pulling rate of 300 mm/minute with Tensilon type tensile test device made by ORIENREC Co. according to JIS K7113. The Young's modulus was determined from slope of initial rise part.

Example 1

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere. Next, from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 99 g and carbon nanotube (trade name VGC FR made by Showa Denko Co, Ltd.) 1 g were stirred using hybrid mixer (HM-500) made by Keyence Co, Ltd., and degassing was carried out.

Thereafter, some of the obtained carbon nanotube added polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of aforementioned polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

Example 2

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere.

Next, from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 95 g and carbon nanotube (trade name VGC FR made by Showa Denko Co, Ltd.) 5 g were stirred using hybrid mixer (HM-500) made by Keyence Co, Ltd., and degassing was carried out.

Thereafter, some of the obtained carbon nanotube added polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of aforementioned polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

Example 3

Into a 500 ml separable flask fitted with DC stirrer were introduced 4,4'-diaminodiphenyl ether 29.15 g (146 mmol)

and N,N'-dimethylacetamide 224 g, and it was stirred at room temperature in nitrogen atmosphere.

Next from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 99.3 g and carbon nanotube (trade name VGC FR made by Showa Denko Co, Ltd.) 0.7 g were stirred using hybrid mixer HM-500 made by Keyence Co, Ltd., and degassing was carried out.

Thereafter, some of the obtained carbon nanotube added polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of aforementioned polyamic acid film under conditions at 200 degrees for 30 minutes, 300 degrees for 20 minutes and 400 degrees for five minutes. The results of the measurement of mechanical properties and electrical characteristics of the obtained polyimide film are shown in Table 1.

Example 4

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere.

Next, from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 99.5 g and carbon nanotube (trade name VGC FR made by Showa Denko Co, Ltd.) 0.5 g were stirred using hybrid mixer HM-500 made by Keyence Co, Ltd., and degassing was carried out.

Thereafter, some of the obtained carbon nanotube added polyamic acid solution was dispensed on polyester film and a uniform membrane was formed using a spin coater. By heating this membrane at 100 degrees for one hour, polyamic acid film of self-supporting properties was obtained. Further, polyimide film was obtained by carrying out heat treatment of aforementioned polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

Example 5

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere.

Next from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 98 g and carbon nanotube (Nanocarbon No. 2 made by Nanodetonation Carbon Co, Ltd.) 2 g were stirred using hybrid mixer HM-500 made by Keyence Co, Ltd., and degassing was carried out.

Thereafter, some of the obtained carbon nanotube added polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of aforementioned polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

Comparative Example 1

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere.

Next, from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

Thereafter, some of the obtained polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of aforementioned polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

Comparative Example 2

Into a 500 ml separable flask fitted with DC stirrer were introduced 4,4'-diaminodiphenyl ether 29.15 g (146 mmol) and N,N'-dimethylacetamide 224 g, and it was stirred at room temperature in nitrogen atmosphere.

Next, from 30 minutes to 1 hour later, pyromellitic acid dianhydride 30.7988 g (141 mmol) was divided into several batches and introduced, it was stirred for one hour, thereafter 15.87 g of a 6 weight percent pyromellitic N,N'-dimethylacetamide solution was dropwise-added over a period of 30 minutes, and it was stirred for further one hour. The viscosity of the obtained polyamic acid solution was 240 Pas.

The obtained polyamic acid solution 98 g and carbon powder (Denka black, granular made by Denki Kagaku Kogyo Co, Ltd.) 2 g were stirred using hybrid mixer HM-500 made by Keyence Co, Ltd., and degassing was carried out.

Thereafter, some of the obtained carbon powder added polyamic acid solution was dispensed on polyester film and a uniform membrane was formed using a spin coater. By heating this membrane at 100 degrees for one hour, polyamic acid film of self-supporting properties was obtained.

Further, polyimide film was obtained by carrying out heat treatment of the obtained polyamic acid film under conditions of 200 degrees for 30 minutes, 300 degrees for 20 minutes and 400 degrees for five minutes. The results of the measurement of mechanical properties and electrical characteristics of the obtained polyimide film are shown in Table 1.

TABLE 1

| Example | Amount Of Carbon (weight %) | Surface/Volume Resistivity (ohms/sq.)/(ohm-cm) | Young's modulus (Gpa) | Elongation breakage (%) |
|---|---|---|---|---|
| Example 1 | 5.2 | $2.50 \times 10^4 / 1.00 \times 10^5$ | 2.31 | 74.8 |
| Example 2 | 22.1 | $2.60 \times 10^3 / 4.30 \times 10^4$ | 2.71 | 33.6 |
| Example 3 | 3.7 | $1.80 \times 10^5 / 1.40 \times 10^7$ | 2.25 | 74.6 |
| Example 4 | 2.6 | $5.50 \times 10^5 / 3.60 \times 10^7$ | 2.23 | 74.3 |
| Example 5 | 9.9 | $5.2 \times 10^3 / 8.03 \times 10^4$ | 2.51 | 64.8 |
| Comp. Ex. 1 | 0.0 | $1.0 \times 10^{18} / 1.00 \times 10^{18}$ | 2.20 | 74.0 |
| Comp. Ex. 2 | 10 | $4.52 \times 10^{15} / 5.11 \times 10^{17}$ | 2.80 | 45.0 |

As it is clear from the results of Table 1, polyimide films of this invention (Examples 1-4) have remarkably improved electrical characteristics without the loss of mechanical properties. These properties include Young's modulus and elongation at breakage. They are compared to the polyimide films of Comparative Example 1 and Comparative Example 2.

Nothing in the foregoing is intended to create limitations to the present invention. Limitations to the present invention are intended to be provided for solely by the following claims.

What is claimed is:

1. An electrically conductive film, comprising:
    A. a continuous or discontinuous, non-conductive first phase comprising a polyimide base polymer, and
    B. a discontinuous, conductive second phase comprising 80, 85, 90, 95, 96, 97, 98, 99 or 100 weight percent carbon nanotube particles, wherein the weight percent of the second phase, based upon the total weight of both phases, is in a range between any two of the following percentages: 0.10, 0.20, 0.30, 0.40, 0.50, 0.75, 1.0, 2.0, 3.0, 4.0, 5.0, 10.0,
    wherein the film has a thickness between eight and 125 microns,
    wherein the film precursor is oriented on a molecular scale in one or more directions to provide a surface electrical resistivity between, and including, any two of the following $1 \times 10^3$, $1 \times 10^4$, $1 \times 10^5$, $1 \times 10^6$, $1 \times 10^7$ ohms per square,
    wherein the film precursor is oriented on a molecular scale in one or more directions to provide a volume electrical resistivity between, and including, any two of the following $1 \times 10^8$, $1 \times 10^9$, $1 \times 10^{10}$, $1 \times 10^{11}$, $1 \times 10^{12}$, $1 \times 10^{13}$, $1 \times 10^{14}$, and $1 \times 10^{15}$ ohms·cm, and
    wherein the film has a mechanical elongation in a range between and including any two of the following 50, 60, 70, 75, 80, 85, 90, 95 and 100 percent.

2. An electrically conductive layer according to claim 1, wherein the volume electrical resistivity is in a range between and including any two the following: $1 \times 10^{12}$, $1 \times 10^{13}$, $1 \times 10^{14}$, and $1 \times 10^{15}$ ohm-centimeters.

3. An electrically conductive film according to claim 1, wherein the layer provides a mechanical elongation of between 50 and 80 percent.

4. A process for making an electrically conductive polyimide film comprising:
    (a) dispersing a carbon nanotube particles into a polar organic solvent to form a slurry;
    (b) mixing the slurry with a polyamic acid derived from a reaction of substantially equimolar amounts of at least one dianhydride and at least one diamine in a polar organic solvent to form a mixed polymer;
    (c) casting the mixed polymer of step (b) onto a surface;
    (d) converting and drawing the cast mixed polymer of step(c) to provide a layer with a solids content of from 95 to 99.99 weight percent and a base polymer that is from 90 to 99.99 percent imidized, wherein the polymer is in the form of a film having a thickness of between eight and 125 microns and having a mechanical elongation between any two of the following numbers 50, 60, 70, 75, 80, 85, 90, 95 and 100 percent, wherein the film precursor is oriented on a molecular scale in one or more directions to provide a surface electrical resistivity between, and including, any two of the following $1 \times 10^3$, $1 \times 10^4$, $1 \times 10^5$, $1 \times 10^6$, $1 \times 10^7$ ohms per square, and wherein the film precursor is oriented on a molecular scale in one or more directions to provide a volume electrical resistivity between, and including, any two of the following $1 \times 10^8$, $1 \times 10^9$, $1 \times 10^{10}$, $1 \times 10^{11}$, $1 \times 10^{12}$, $1 \times 10^{13}$, $1 \times 10^{14}$, and $1 \times 10^{15}$ ohms·cm.

5. The process of claim 4 wherein the film has a surface resistivity in a range from $1 \times 10^3$ to $1 \times 10^6$ ohms per square.

6. The process of claim 4 wherein the film has a volume resistivity in a range from $1 \times 10^8$ to $1 \times 10^{12}$ ohms·cm.

7. The process of claim 4 wherein the conversion of step (d) comprises a thermal conversion step.

8. The process of claim 4 wherein the film contains dispersed therein from 0.10 to 5.0 weight percent of carbon nanotube particles.

9. The process of claim 4 wherein the film contains dispersed therein from two to five weight percent of carbon nanotube particles.

* * * * *